(12) United States Patent
Meyer et al.

(10) Patent No.: US 8,003,515 B2
(45) Date of Patent: Aug. 23, 2011

(54) DEVICE AND MANUFACTURING METHOD

(75) Inventors: Thorsten Meyer, Regensburg (DE); Andreas Bahr, Bach (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 12/562,701

(22) Filed: Sep. 18, 2009

(65) Prior Publication Data

US 2011/0068484 A1    Mar. 24, 2011

(51) Int. Cl.
*H01L 21/4763* (2006.01)

(52) U.S. Cl. ........ 438/622; 438/106; 438/110; 438/127; 257/E21.499; 257/E21.502; 257/E21.508

(58) Field of Classification Search .................... 438/63, 438/641

See application file for complete search history.

(56) References Cited

U.S. PATENT DOCUMENTS

| | | | |
|---|---|---|---|
| 2007/0114662 A1* | 5/2007 | Helneder et al. | 257/737 |
| 2008/0038874 A1* | 2/2008 | Lin | 438/118 |
| 2008/0169539 A1* | 7/2008 | Fang et al. | 257/676 |
| 2009/0170241 A1* | 7/2009 | Shim et al. | 438/107 |

* cited by examiner

*Primary Examiner* — Cheung Lee
(74) *Attorney, Agent, or Firm* — Dicke, Billig & Czaja, PLLC

(57) ABSTRACT

A description is given of a device, including a semiconductor chip, a first metal layer laterally extending over the semiconductor chip, the first metal layer having a first thickness. A dielectric layer laterally extends over the first metal layer, and a second metal layer laterally extends over the dielectric layer, the second metal layer having a second thickness that is at least four times larger than the first thickness.

22 Claims, 19 Drawing Sheets

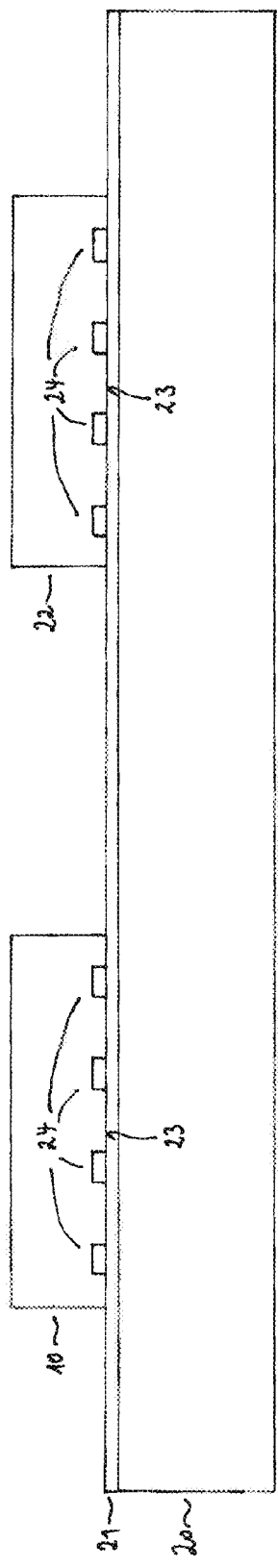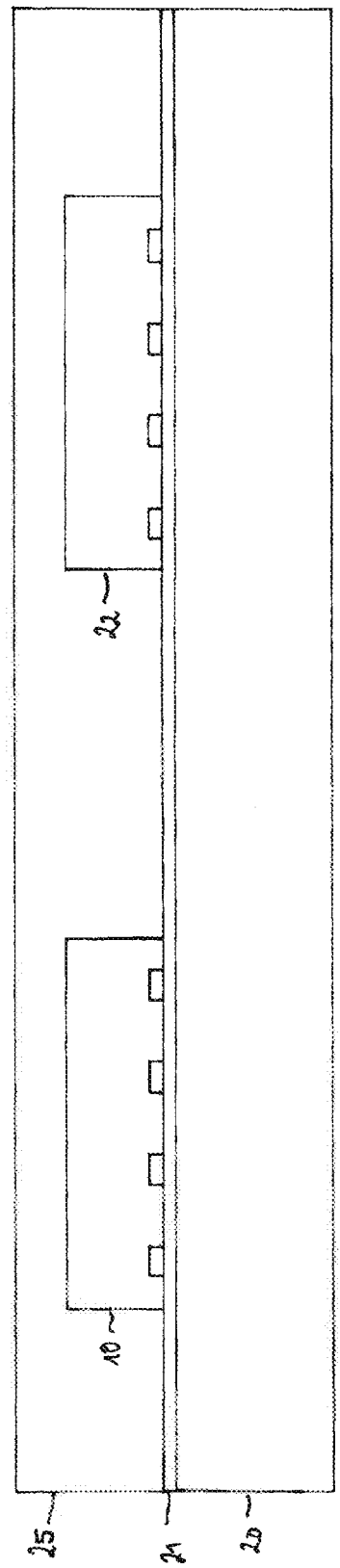

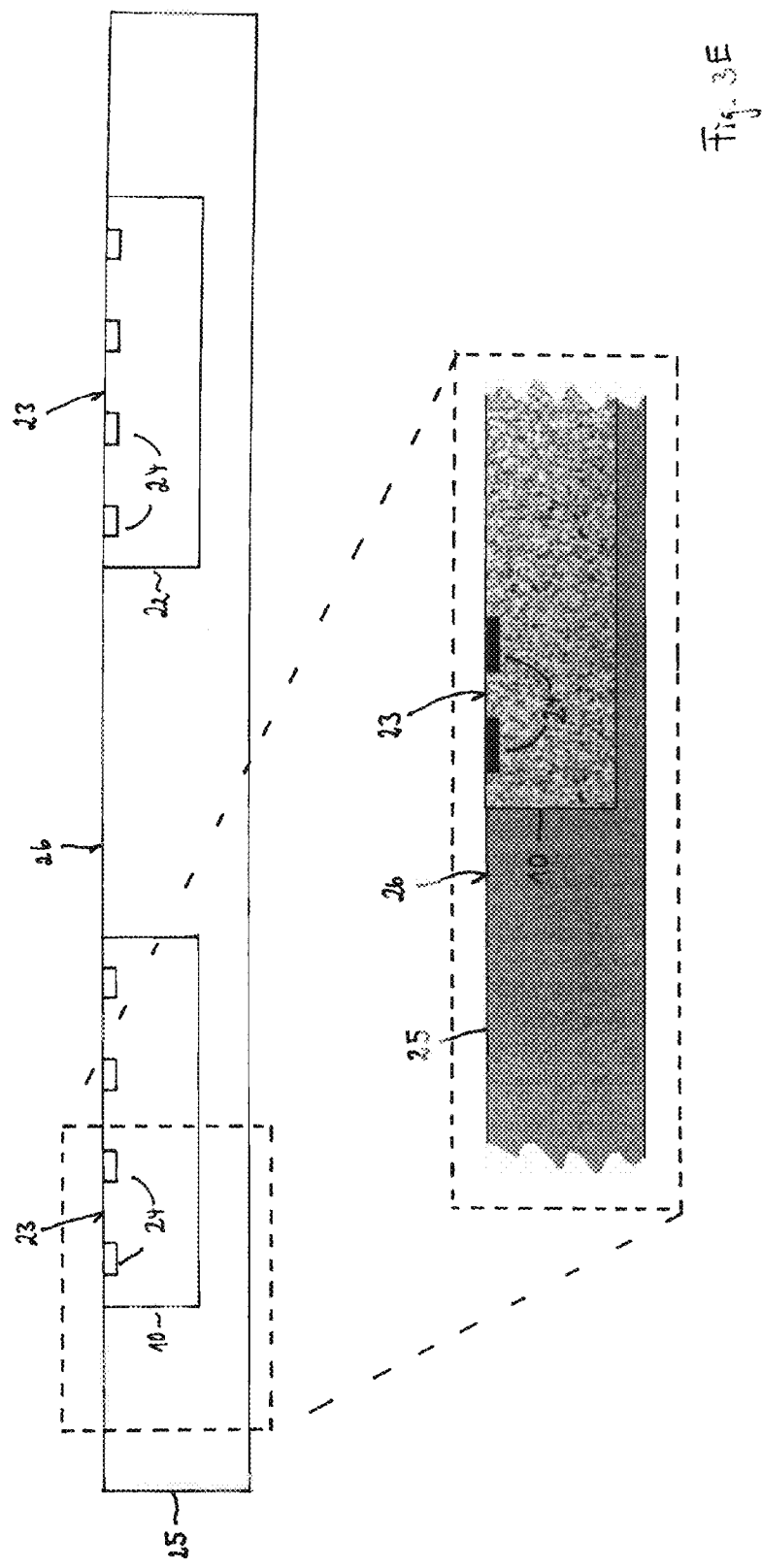

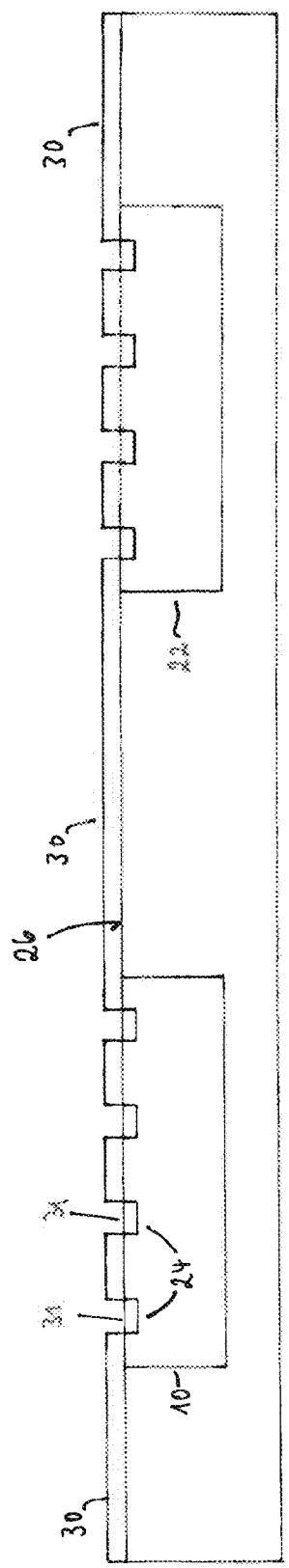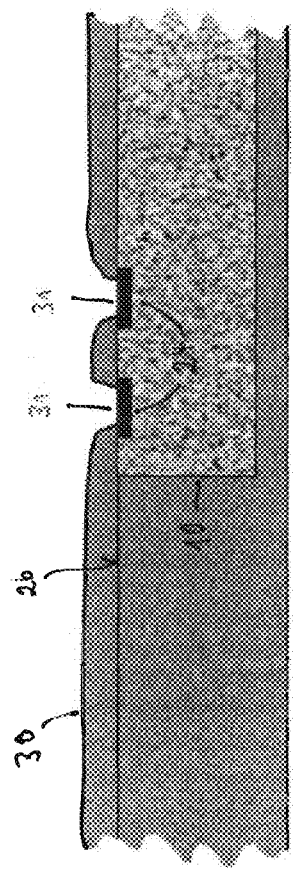
Fig. 3F

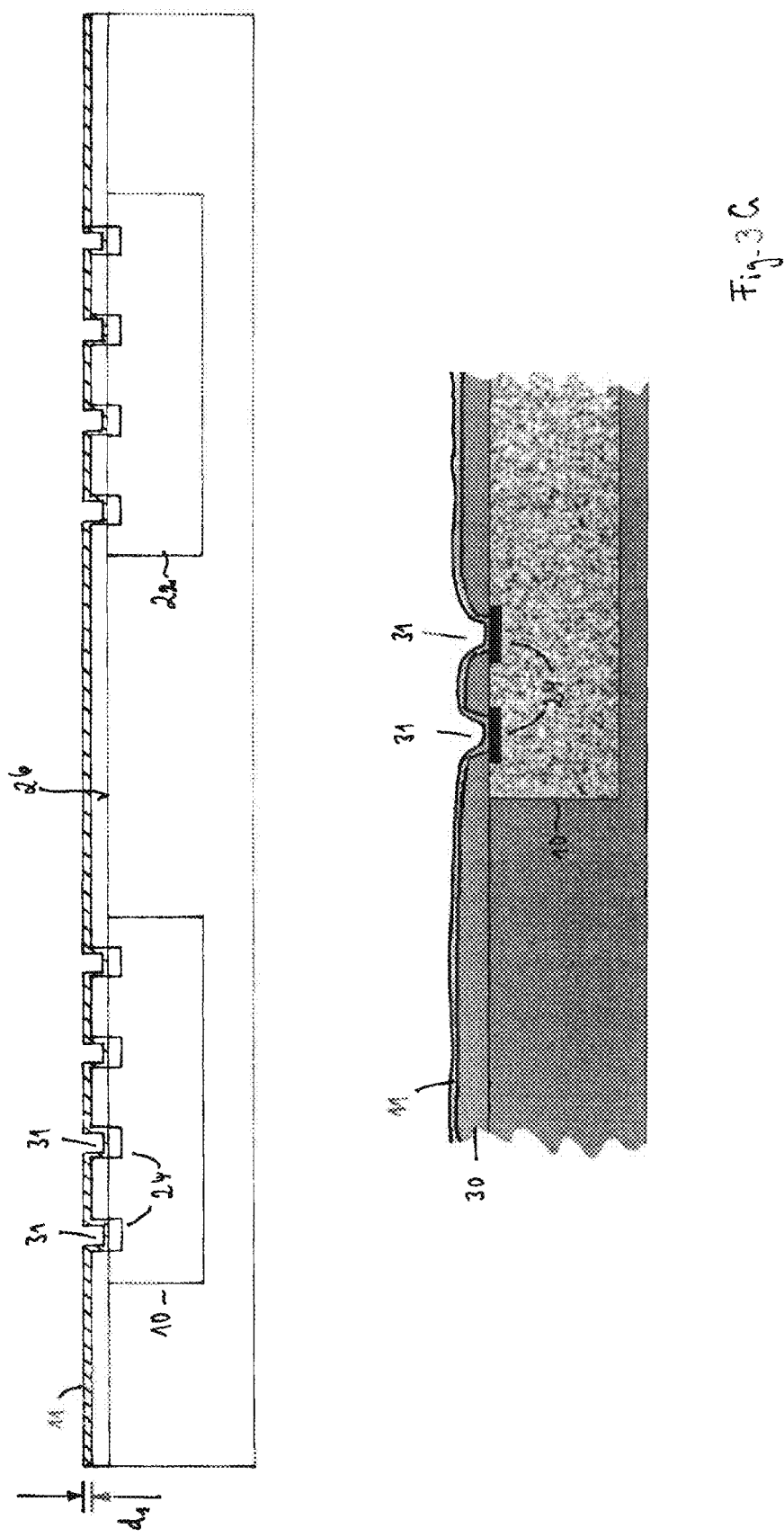

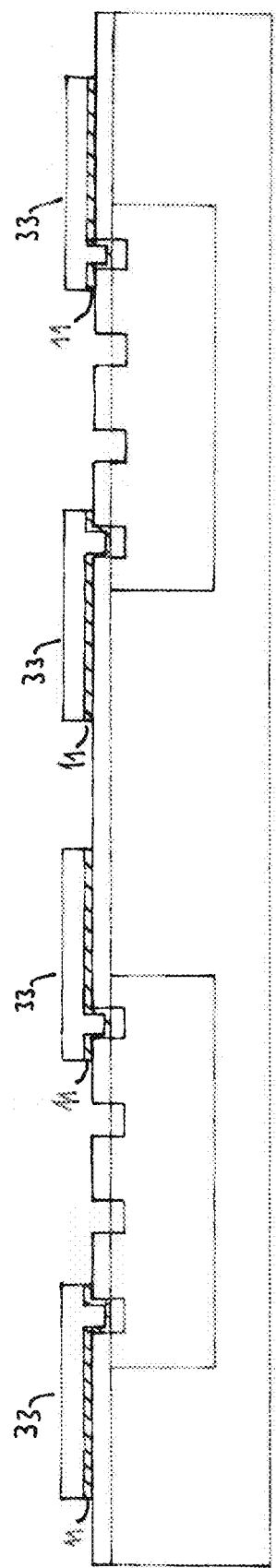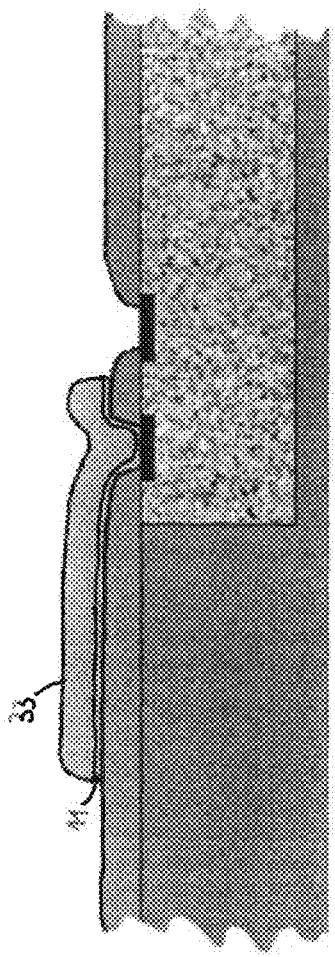
Fig. 3I

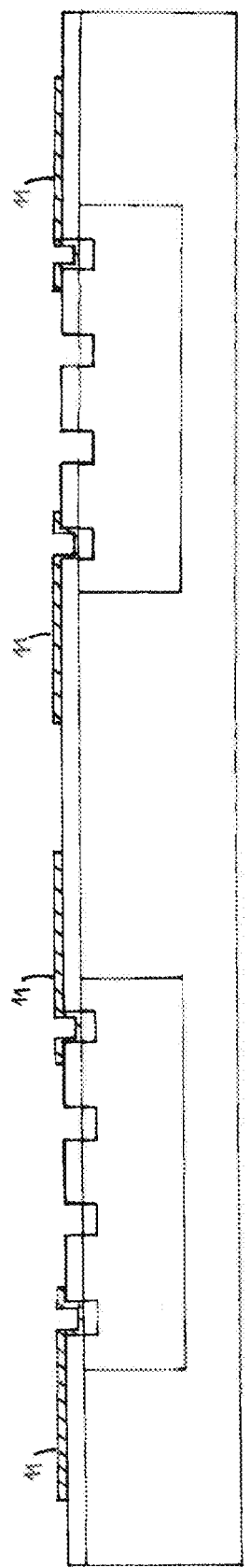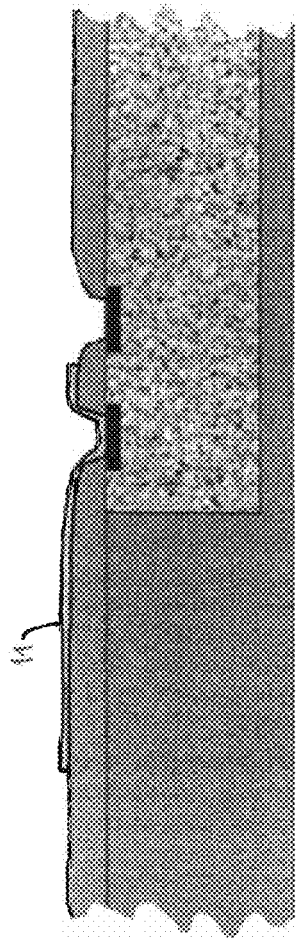
Fig. 37

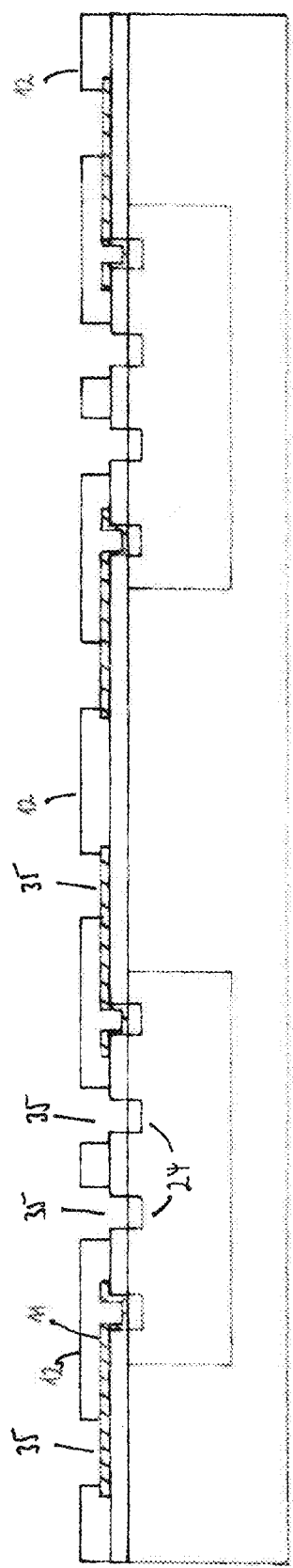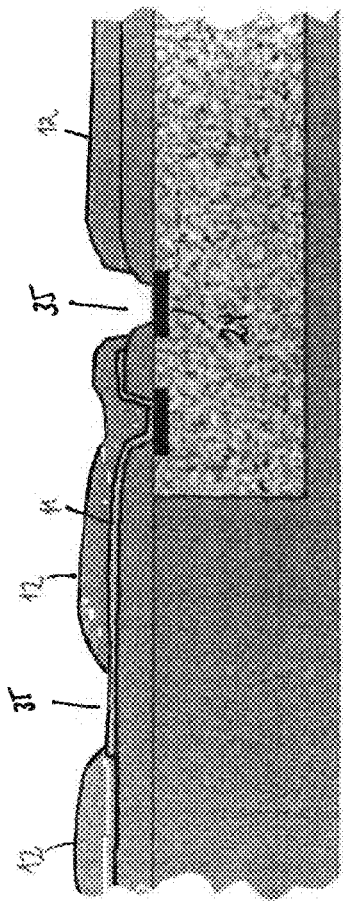
Fig. 3k

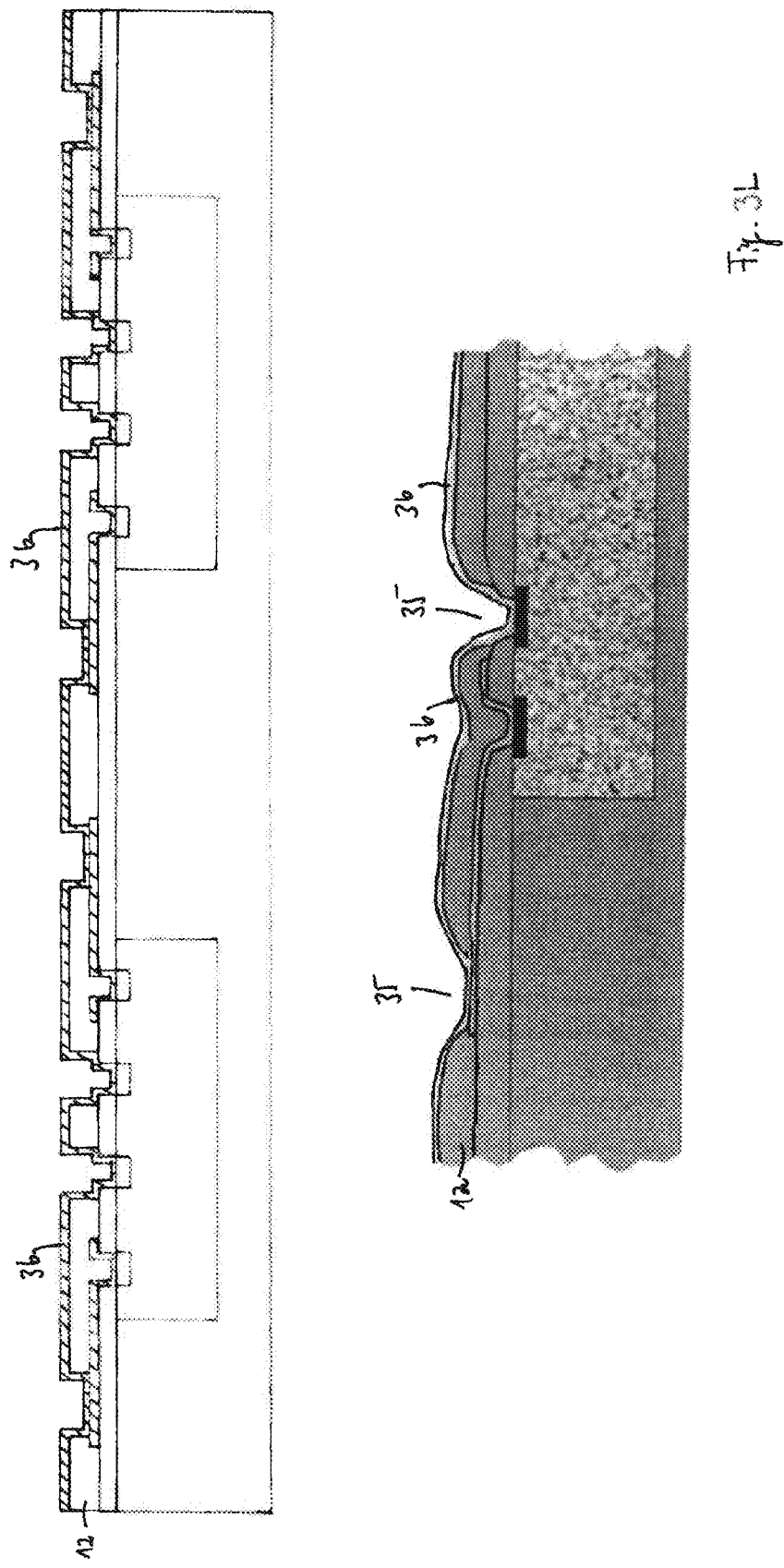

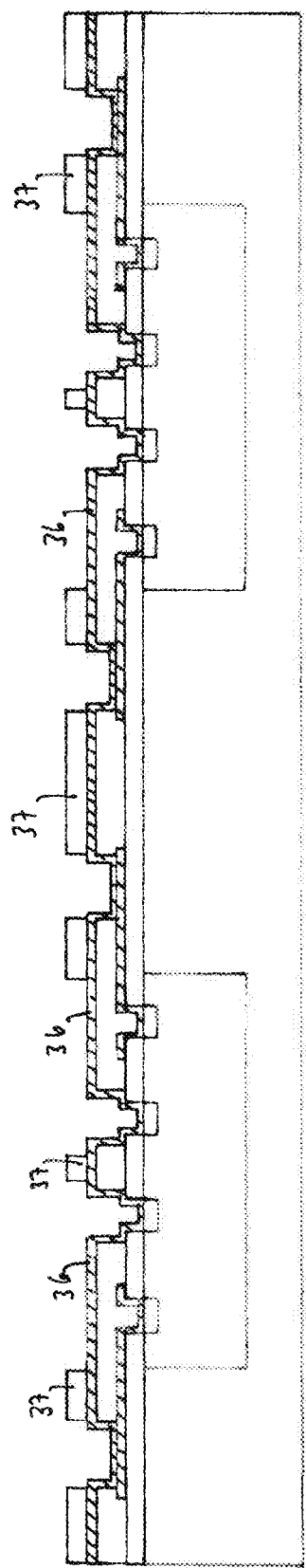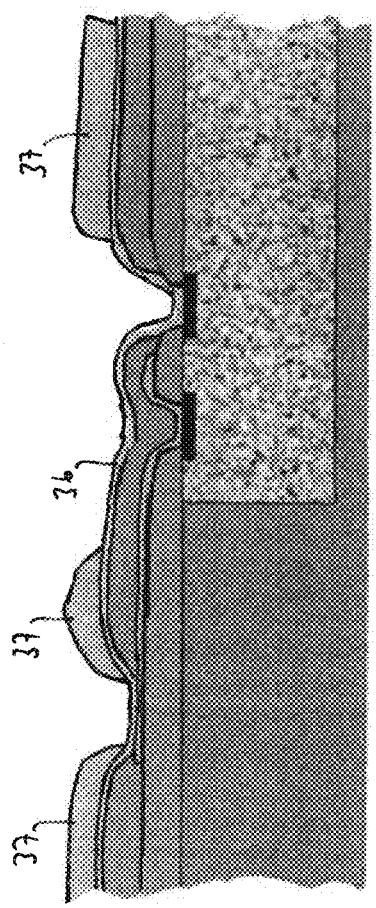
Fig. 3H

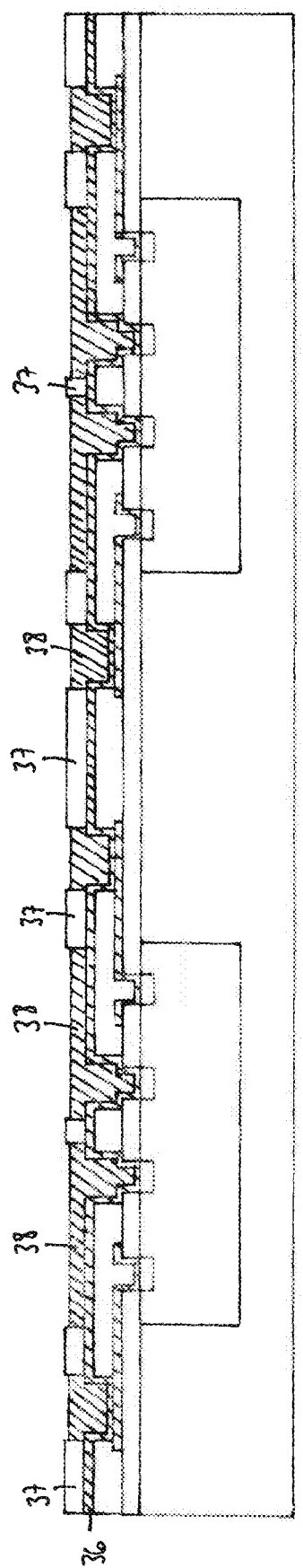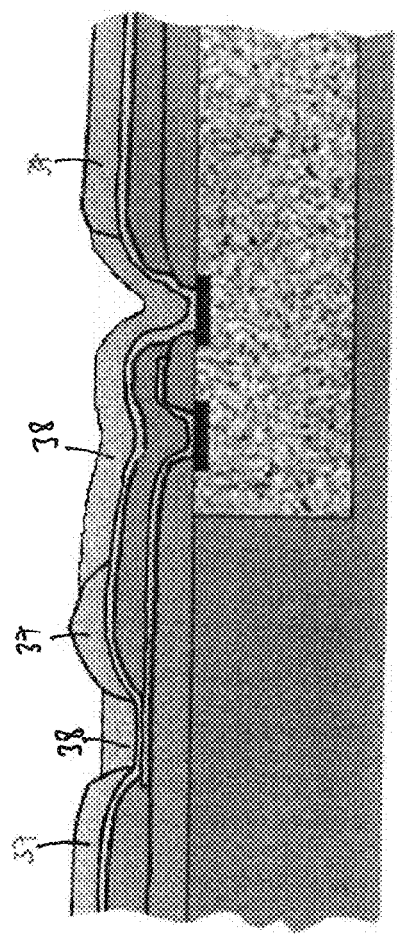
Fig. 3N

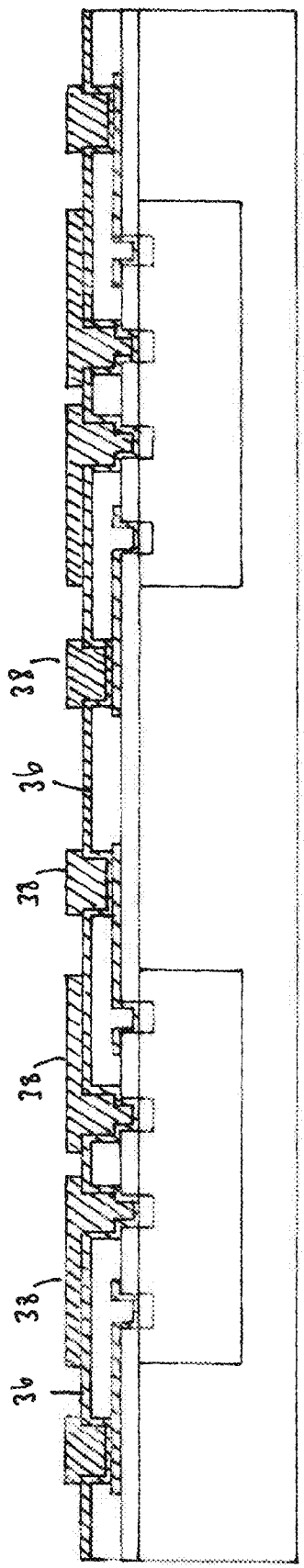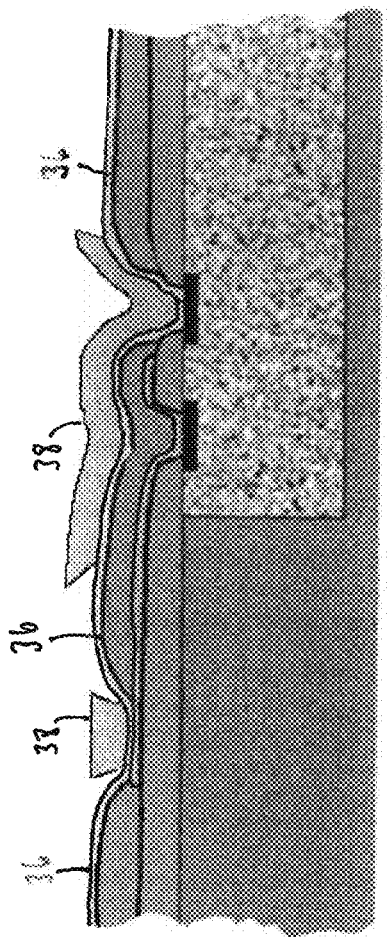
Fig. 30

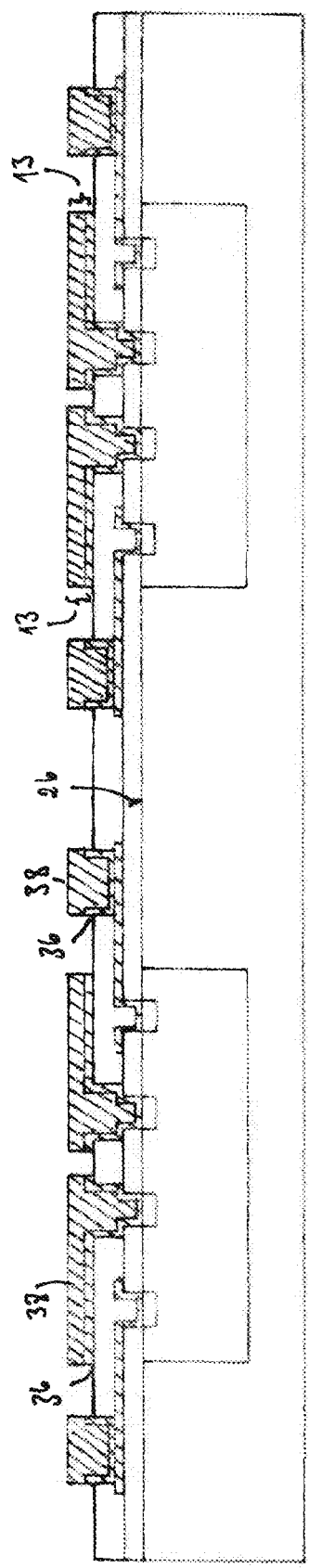
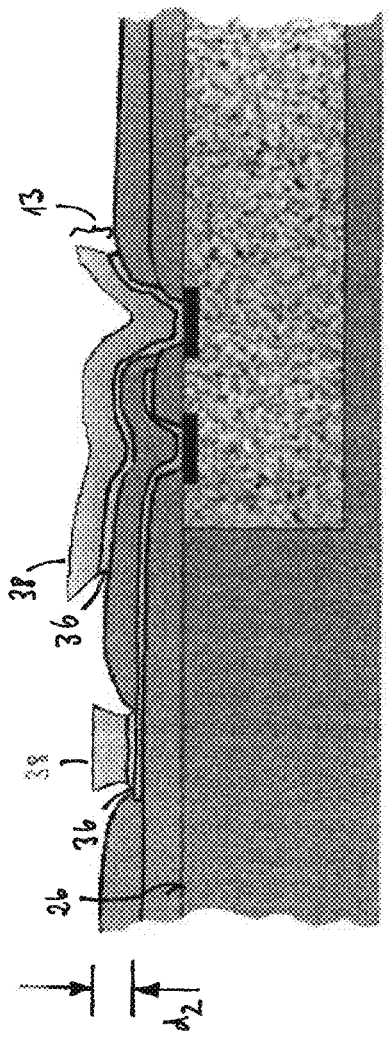
Fig. 3P

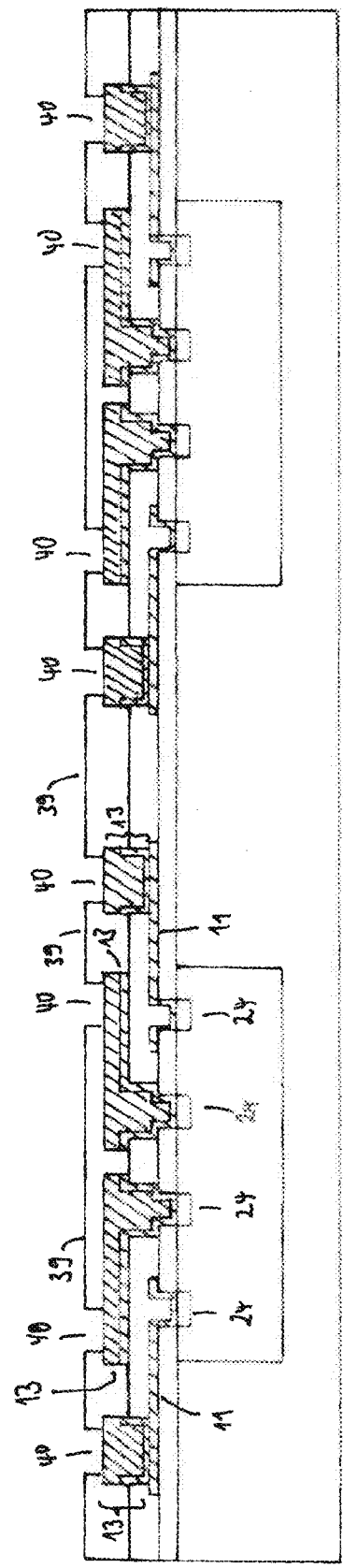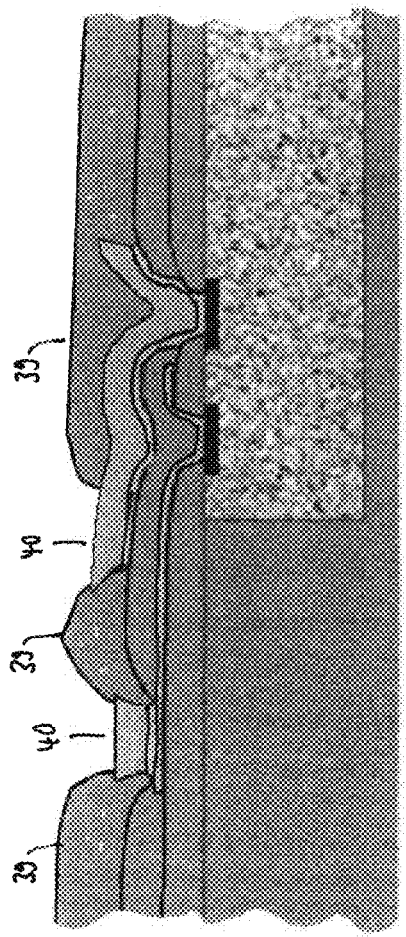
Fig. 3Q

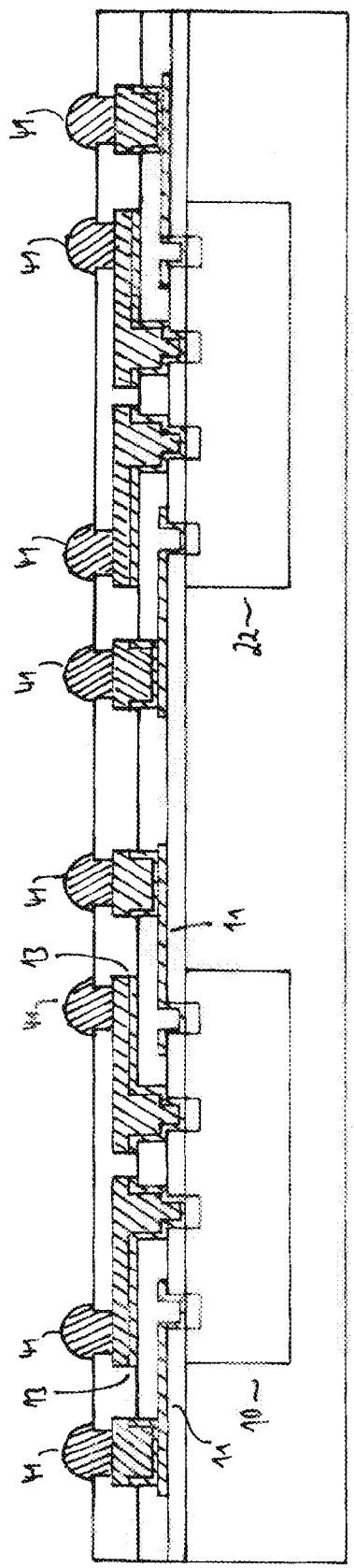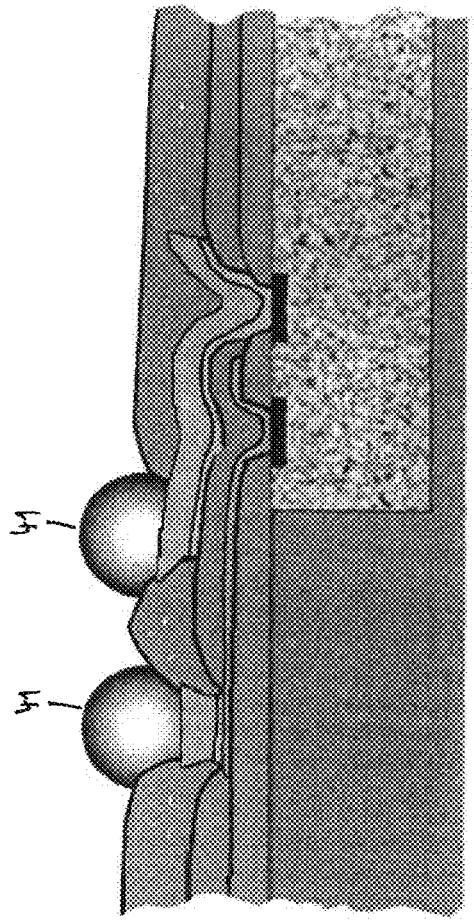
Fig. 3R

DEVICE AND MANUFACTURING METHOD

BACKGROUND

This invention relates to a device including a semiconductor chip, a first metal layer placed over the semiconductor chip and a second metal layer placed over the semiconductor chip. Furthermore, the invention relates to a method of manufacturing such a device.

Wafer level packaging is gaining interest throughout the semiconductor industry. Conductor lines are used to provide redistribution layers in the wafer level packages. Redistribution layers including two or more metallization layers may be used especially for complex products.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
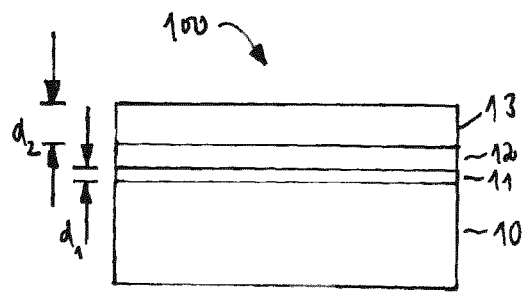
FIG. 1 schematically illustrates a cross-sectional view of one embodiment of a device including a semiconductor chip, a first metal layer, a dielectric layer and a second metal layer.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include for example integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example pressure sensors, acceleration sensors, rotation sensors, microphones etc. The semiconductor chips may be configured as antennas and/or discrete passives and/or chip stacks. Semiconductor chips in which such functional elements are embedded generally contain electronic circuits which serve for driving the functional elements or further process signals generated by the functional elements. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The devices described below include external contact pads (or external contact elements), which may be of any shape and size. The external contact pads may be accessible from outside the device (or solder deposits may be placed on the external contact pads) and may thus allow electrical contact to be made with the semiconductor chips from outside the device. Furthermore, the external contact pads may be thermally conductive and may serve as heat sinks for dissipating the heat generated by the semiconductor chips. The external contact pads may be composed of any desired electrically conductive material, for example of a metal, such as copper, aluminum, nickel or gold, a metal alloy or an electrically conductive organic material. Solder material, such as solder balls or solder bumps, may be deposited on the external contact pads.

Two or more metal layers may be placed over the semiconductor chip. The metal layers may laterally extend over the semiconductor chip or over other layers arranged between the semiconductor chip and the metal layers, such as a dielectric layer. One or more of the metal layers may be partially located outside of the outline of the semiconductor chip. It may also be provided that one or more of the metal layers are not located outside of the outline of the semiconductor chip, meaning these metal layers are located within the outline of the semiconductor chip. The metal layers may, for example, be used to produce a redistribution layer. The metal layers may be employed as wiring layers to make electrical contact with the semiconductor chips from outside the device and/or to make electrical contact with other semiconductor chips and/or components contained in the device. The metal layers may couple the contact pads of the semiconductor chips to the external contact pads. The metal layers may have other functions as well, for example they may be used as ground or electrical shielding layers. The metal layers may be manufactured with any desired geometric shape and any desired material composition. For example, the metal layers may be structured and may have the shape of conductor lines (or conductor tracks), but may also be in the form of a layer covering an area. Any desired metal, for example aluminum, nickel, palladium, titanium, titanium tungsten, silver, tin, gold or copper, or metal alloys may be used as the material. The metal layers need not be homogenous or manufactured from just one material, that is to say various compositions and concentrations of the materials contained in the metal layers are possible. Furthermore, the metal layers may be arranged above or below or between electrically insulating layers. The metal layers may have different thicknesses. For example, the metal layer adjacent to the semiconductor chip may have a smaller thickness than at least one of the metal layers placed over this metal layer.

The semiconductor chips or at least parts of the semiconductor chips may be covered with an encapsulation material. The encapsulation material may be electrically insulating and may be any appropriate duroplastic, thermoplastic or thermosetting material or laminate (prepreg) and may contain filler materials. Various techniques may be employed to cover the semiconductor chips with the electrically insulating material, for example compression molding, injection molding, powder molding, liquid molding or lamination.

The encapsulation material may be used to produce fan-out type packages. In a fan-out type package at least some of the external contact pads and/or metal layers connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

FIG. 1 schematically illustrates one embodiment of a device 100 in cross section. The device 100 includes a semiconductor chip 10, a first metal layer 11 laterally extending over the semiconductor chip 10, a dielectric layer 12 laterally extending over the first metal layer 11 and a second metal layer 13 laterally extending over the dielectric layer 12. The first metal layer 11 has a thickness $d_1$ and the second metal layer 13 has a thickness $d_2$. The thickness $d_2$ is at least four times larger than the thickness $d_1$.

Figure 2A:
FIGS. 2A to 2D schematically illustrate a cross-sectional view of one embodiment of a method of manufacturing a device including a semiconductor chip, a first metal layer, a dielectric layer and a second metal layer.
Figure 2B:
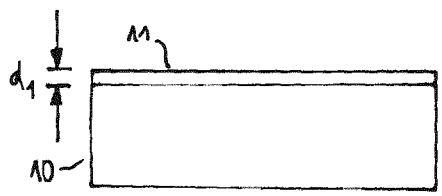
Figure 2C:
Figure 2D:
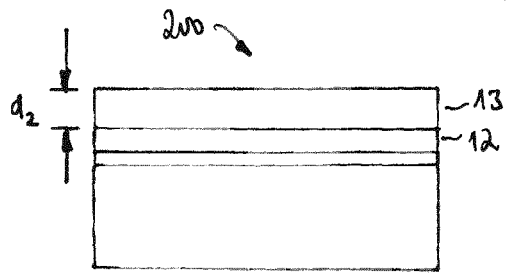

FIGS. 2A to 2D schematically illustrate one embodiment of a method for production of a device 200. A cross section of the device 200 obtained by the method is illustrated in FIG. 2D. Firstly, a semiconductor chip 10 is provided (see FIG. 2A). A first metal layer 11 is placed over the semiconductor chip 10 (see FIG. 2B). The first metal layer 11 has a thickness $d_1$. A dielectric layer 12 is placed over the first metal layer 11 (see FIG. 2C), and a second metal layer 13 is placed over the dielectric layer 12 (see FIG. 2D). The second metal layer 13 has a thickness $d_2$ that is at least four times larger than the thickness $d_1$.

Figure 3A:
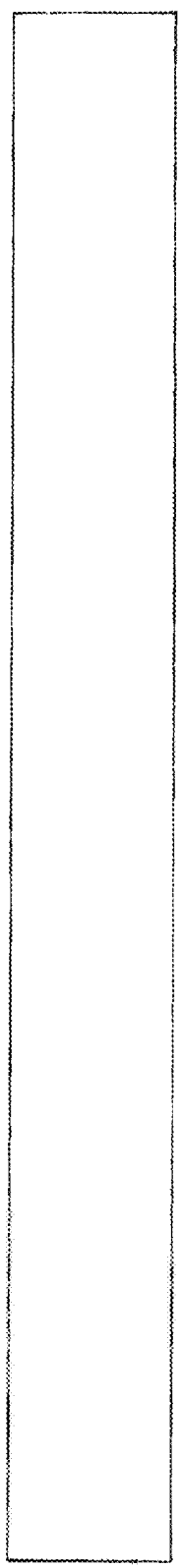
FIGS. 3A to 3S schematically illustrate a cross-sectional view of one embodiment of a method of manufacturing a device including a semiconductor chip embedded in an encapsulation material, two metallization layers and solder balls deposited on external contact pads.
Figure 3B:
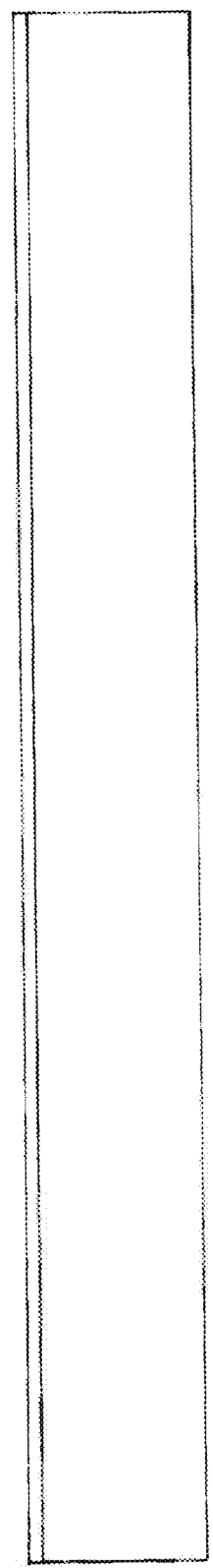
Figure 3H:
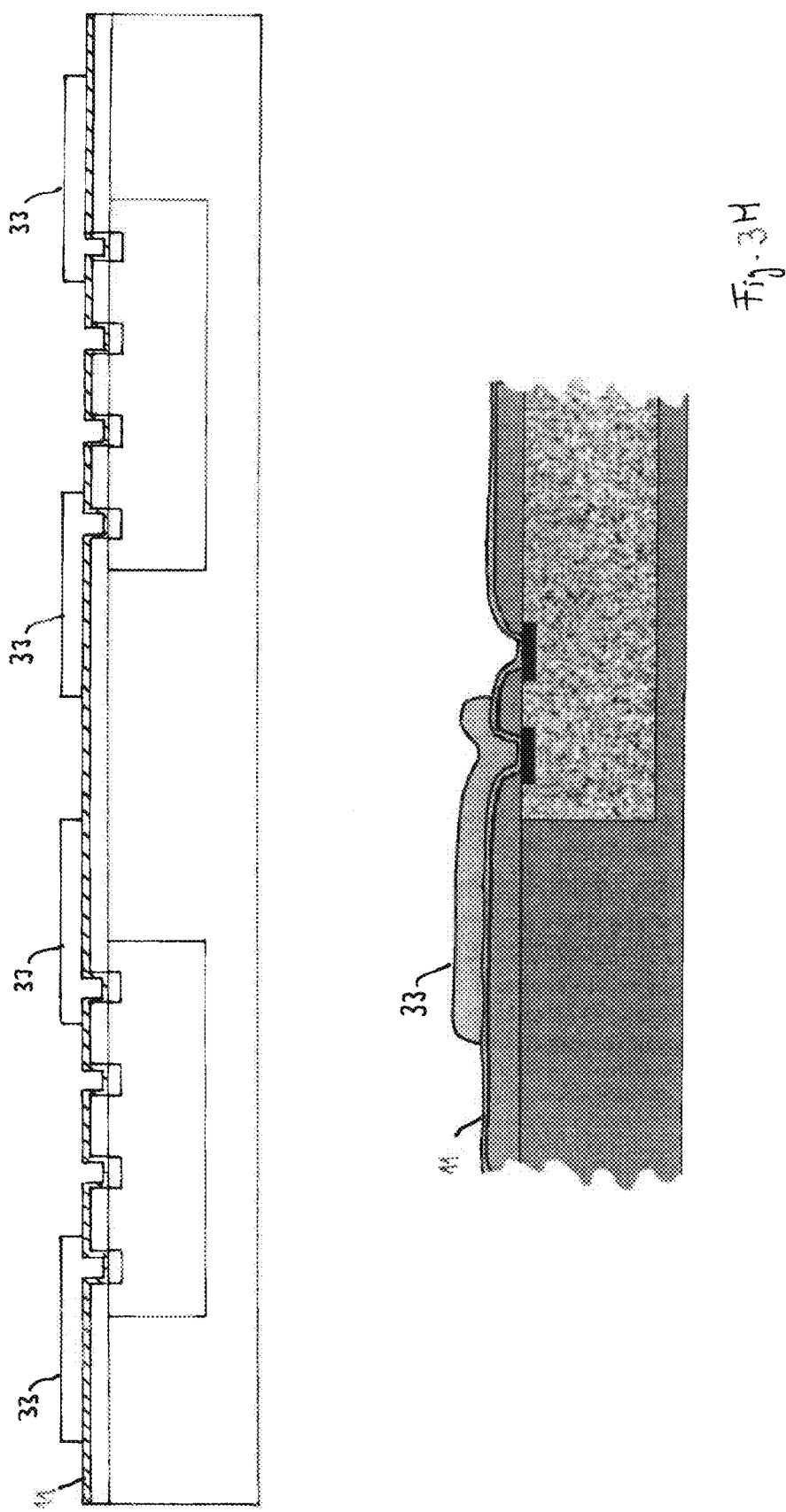
Figure 3S:
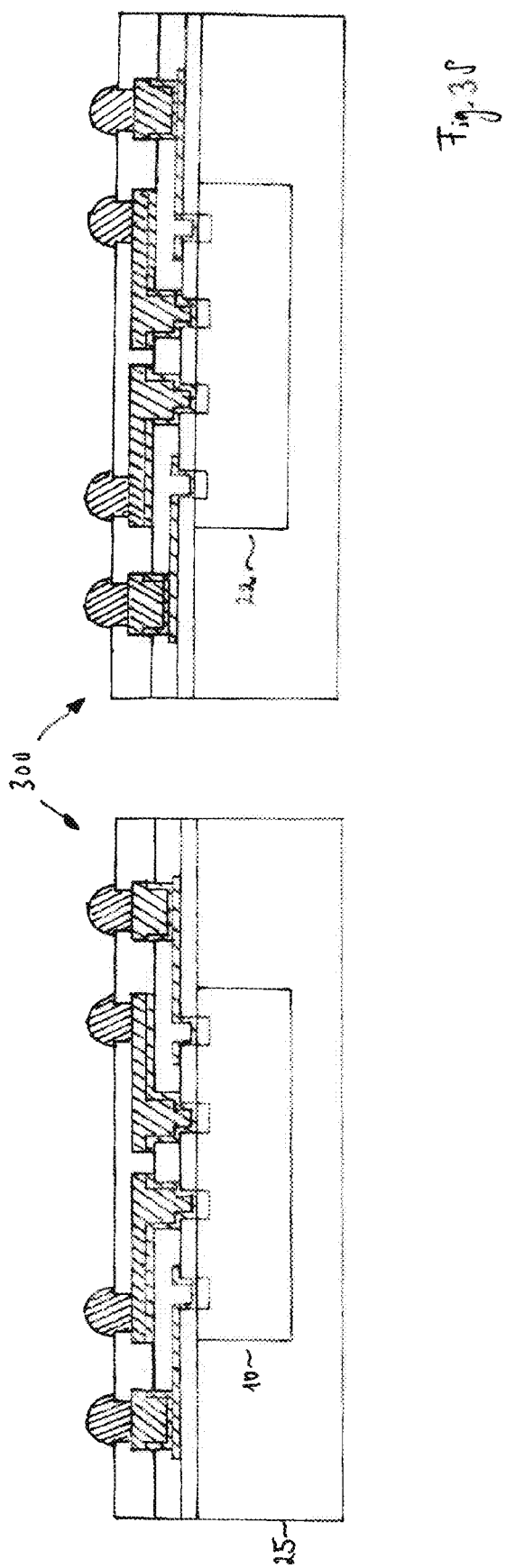

FIGS. 3A to 3S schematically illustrate one embodiment of a method for production of a device 300, a cross section of which is illustrated in FIG. 3S. The device 300 is an implementation of the devices 100 and 200. The details of the device 300 that are described below can therefore be likewise applied to the devices 100 and 200. Furthermore, the method illustrated in FIGS. 3A to 3S is an implementation of the method illustrated in FIGS. 2A to 2D. The details of the production method that are described below can therefore be likewise applied to the method of FIGS. 2A to 2D.

In order to manufacture the device 300, a carrier 20 is provided as illustrated in FIG. 3A. The carrier 20 may be a plate made of a rigid material, for example a metal, such as nickel, steel or stainless steel, laminate, film or a material stack. The carrier 20 may have at least one flat surface on which components of the device 300 can be placed. The shape of the carrier 20 is not limited to any geometric shape, for example the carrier 20 may be round or square-shaped. The carrier 20 may have any appropriate size.

An adhesive tape 21, for example a double sided sticky tape, may be laminated onto a surface of the carrier 20 as illustrated in FIG. 3B. The surface of the carrier 20 on which the adhesive tape 21 is laminated is the surface where the components of the device 300 are placed later on.

As illustrated in FIG. 3C, a first semiconductor chip 10 and a second semiconductor chip 22 as well as possibly further semiconductor chips are placed over the carrier 20. The semiconductor chips 10 and 22 can be fixed on the adhesive tape 21. For attaching the semiconductor chips 10 and 22 to the carrier 20, other kinds of attaching materials may in one embodiment be used. The semiconductor chips 10 and 22 and the further semiconductor chips may be arranged in an array (only two of the semiconductor chips are illustrated in FIG. 3C).

The semiconductor chips 10 and 22 are relocated on the carrier 20 in larger spacing as they have been in the wafer bond. The semiconductor chips 10 and 22 may have been manufactured on the same semiconductor wafer, but may in one embodiment have been manufactured on different wafers. Furthermore, the semiconductor chips 10 and 22 may be physically identical, but may also contain different integrated circuits and/or represent other components. Before the semiconductor chips 10 and 22 are placed on the carrier 20, they may be thinned, for example by grinding their backsides, down to a thickness in the range from 30 to 300 μm. The function and dimensions of the semiconductor chip 10 may be different from the function and dimensions of the semiconductor chip 22, however both semiconductor chips 10 and 22 may also have the same functions and dimensions.

The semiconductor chips 10 and 22 have active main surfaces 23 and may be arranged over the carrier 20 with their active main surfaces 23 facing the carrier 20. The semiconductor chips 10 and 22 may have contact pads 24 located on their active main surfaces 23. The integrated circuits embedded in the semiconductor chips 10 and 22 can be electrically accessed via the contact pads 24. The contact pads 24 may be made of a metal, for example aluminum or copper.

After the semiconductor chips 10 and 22 have been mounted on the carrier 20, they are encapsulated by an electrically insulating encapsulating material 25 (e.g., a mold material) thereby forming a layer of the electrically insulating material 25 as illustrated in FIG. 3D. For example, the electrically insulating material 25 may be a duroplastic or thermosetting mold material. The gaps between the semiconductor chips 10 and 22 are also filled with the mold material 25 so that the mold material 25 covers the side surfaces of the semiconductor chips 10 and 22. The mold material 25 may be based on an epoxy material and may contain a filling material consisting of small particles of glass ($SiO_2$) or other electrically insulating mineral filler materials like $Al_2O_3$ or organic filler materials.

As an alternative to the mold material, another material (e.g., a polymer material) may be used as the electrically insulating material 25 to encapsulate the semiconductor chips 10 and 22. The polymer material 25 may have the shape of an electrically insulating foil or sheet, which is laminated on top of the semiconductor chips 10 and 22 as well as the carrier 20. Heat and pressure may be applied for a time suitable to attach the polymer foil or sheet 25 to the underlying structure. The gaps between the semiconductor chips 10 and 22 are also filled with the polymer material 25. The polymer material 25 may, for example, be a prepreg (short for preimpregnated fibers) that is a combination of a fiber mat, for example glass or carbon fibers, and a resin, for example a duroplastic material. Prepreg materials are usually used to manufacture PCBs (printed circuit boards). Known prepreg materials that can be used here as the polymer material 25 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10 and 22 and hardened during a heat-treatment. For the lamination of the prepreg the same or similar processes can be used as in PCB manufacturing.

The semiconductor chips 10 and 22 covered with the electrically insulating material 25 are released from the carrier 20, and the adhesive tape 21 is pealed from the semiconductor chips 10 and 22 as well as from the electrically insulating material 25 as illustrated in FIG. 3E. The adhesive tape 21 may feature thermo-release properties, which allow the removal of the adhesive tape 21 during a heat-treatment. The removal of the adhesive tape 21 from the carrier 20 is carried out at an appropriate temperature, which depends on the thermo-release properties of the adhesive tape 21 and is usually higher than 150° C.

After the release of the carrier 20 and the adhesive tape 21 the active main surfaces 23 of the semiconductor chips 10 and 22 as well as the bottom surface of the electrically insulating material 25 form a common planar surface 26. As described in the following, a redistribution layer may be applied to the surface 26.

In FIGS. 3E to 3R a part of the electrically insulating layer 25, the semiconductor chip 10 and the redistribution layer is illustrated in an enlarged view. In FIG. 3E this part is indicated by dashed lines.

The redistribution layer may be placed over common planar surface 26 of the semiconductor chips 10, 22 and the electrically insulating material 25. For that purpose, a dielectric layer 30 may be deposited on the surface 26 as illustrated in FIG. 3F. The dielectric layer 30 may be fabricated in various ways. For example, the dielectric layer 30 may be deposited from a gas phase or from a solution, or can be laminated onto the surface 26. Furthermore, thin-film technology methods or a standard PCB industry process flow can be used for the application of the dielectric layer 30. The dielectric layer 30 may be fabricated from a polymer, such as parylene, photoresist material, imide, epoxy, duroplast, silicone, silicon nitride or an inorganic, ceramic-like material, such as silicone-carbon compounds. The thickness of the dielectric layer 30 may be up to 10 µm or even higher.

In order to make electrical contacts to the integrated circuits embedded in the semiconductor chips 10 and 22, the dielectric layer 30 may be opened in areas where the contact pads 24 are arranged as illustrated in FIG. 3F. The openings 31 in the dielectric layer 30 may, for example, be produced by using photolithographic methods and/or etching methods.

The dielectric layer 30 may also be omitted. In cases where electrodes, in one embodiment back side electrodes, of the semiconductor chips 10 and 22 reach to the side surfaces of the semiconductor chips 10 and 22, the dielectric layer 30 may prevent short circuits with metal layers of the redistribution layer.

A first metal layer 11 is placed over the dielectric layer 30 as illustrated in FIG. 3G. The first metal layer 11 also covers the contact pads 24 exposed by the openings 31 in the dielectric layer 30. The first metal layer 11 may have a thickness $d_1$ which may be smaller than 500 nm or 450 nm or 400 nm or 350 nm or 300 nm or 250 nm or 200 nm or 150 nm. The thickness $d_1$ of the first metal layer 11 may be measured in areas where the first metal layer 11 extends laterally to the surface 26. The thickness $d_1$ may be the average of the thickness values measured in this area or may be the maximum value of the thickness values measured in this area. The first metal layer 11 may be deposited by using, for example, sputtering, electroless deposition, evaporation or any other appropriate technique. Sputtering is a process whereby small particles, for example atoms, are ejected from a solid target material due to bombardment of the target by energetic particles, for example ions. Electroless deposition (also known as electroless or chemical or auto-catalytic or non-galvanic plating) involves the deposition of metal particles from a solution onto a surface without the use of external electrical power. That means that the solution containing the metal particles is applied to the surface to be coated with the metal, and the metal particles then adhere to the surface without the need of applying an external voltage to the solution and the surface. Evaporation involves evaporating a source material in a vacuum. The vacuum allows vapor particles to travel directly to the surface to be covered where the vapor particles condense back to a solid state.

According to one embodiment, the first metal layer 11 may be composed of two thin metal layers stacked on each other. First a layer of titanium, titanium tungsten, chromium or any other suitable metal or metal alloy may be deposited on the top surfaces of the dielectric layer 30 and the exposed contact pads 24. In one embodiment this layer may have a thickness smaller than 100 nm and in one embodiment about 50 nm. The function of the this layer may be to promote the adhesion of further metal layers and to prevent the diffusion of metal particles into the semiconductor chips 10 and 22. A further metal layer, for example a copper layer, may be deposited on the adhesion promoter/diffusion barrier layer. In one embodiment this layer may have a thickness smaller than 200 nm and in one embodiment about 150 nm. The function of this layer may be to provide sufficient electrical conductivity. The adhesion promoter/diffusion barrier layer as well as the layer providing electrical conductivity may be deposited by using sputtering, electroless deposition, evaporation or any other appropriate technique.

An etch resist layer 33, for example a photoresist layer, may be spin-coated on top of the first metal layer 11. By exposure to light having a suitable wavelength through a mask and subsequent development, the etch resist layer 33 is selectively removed as illustrated in FIG. 3H. Instead of spin-coating, exposure to light and development, the etch resist layer 33 may also be deposited by using printing techniques.

The portions of the first metal layer 11, which are not covered with the etch resist layer 33, may be removed by an etching process thereby creating a structured first metal layer 11 as illustrated in FIG. 3I. In case the first metal layer 11 consists of more than one metal layer, for example an adhesion promoter/diffusion barrier layer and a layer providing electrical conductivity, more than one etching step may be necessary to remove the first metal layer 11.

Subsequently, the etch resist layer 33 is stripped away by using an appropriate solvent as illustrated in FIG. 3J.

A dielectric layer 12 may be deposited on top of the first metal layer 11 and the other layers deposited on the surface 26 and may be opened in areas where external contact pads are arranged later on and where contact pads 24 of the semiconductor chips 10 and 22 are located that are not electrically coupled to the first metal layer 11 as illustrated in FIG. 3K. The dielectric layer 12 may be produced by using the same or similar materials and processing as described above in connection with the dielectric layer 30.

A seed layer 36 may be deposited on the top surface of the dielectric layer 12 and the underlying surfaces exposed by the openings 35 in the dielectric layer 12 as illustrated in FIG. 3L. The seed layer 36 may be made of a suitable metal or metal alloy and may have a thickness smaller than 300 nm. The seed layer 36 may be manufactured by using similar or identical methods as described above in connection with the first metal layer 11. For example, the seed layer 36 may consist of an adhesion promoter/diffusion barrier layer and a layer providing electrical conductivity. Furthermore, the seed layer 36 may be deposited by using sputtering, electroless deposition, evaporation or any other appropriate technique.

A plating resist layer 37, for example a photoresist layer, may be spin-coated on top of the seed layer 36. By exposure to light having a suitable wavelength through a mask and subsequent development, the plating resist layer 37 is selectively removed as illustrated in FIG. 3M. Instead of spin-coating, exposure to light and development, the plating resist layer 37 may also be deposited by using printing techniques.

Subsequently, the parts of the seed layer 36, which are not covered with the plating resist layer 37, may be reinforced by galvanic deposition of a further metal layer 38 as illustrated in FIG. 3N. During the galvanic deposition of the metal layer 38, the seed layer 36 is employed as an electrode. Copper or other metals or metal alloys may be plated onto the seed layer 36 in the unmasked areas and to the desired height, which may be larger than 2 µm or 3 µm or 4 µm or 5 µm or 6 µm or 7 µm or 8 µm or 9 µm or 10 µm. Furthermore, another metal layer, for example a nickel layer, may be galvanically plated on top of the metal layer 38 to avoid the consumption of copper of the metal layer 38 by solder deposits which may be applied to the redistribution layer later on.

After the plating of the metal layer 38 the plating resist layer 37 is stripped away by using an appropriate solvent as illustrated in FIG. 3O. The now exposed parts of the seed layer 36, which are not covered with the metal layer 38, may be removed by one or more etching steps thereby creating a structured metal layer consisting of the seed layer 36 and the metal layer 38 as illustrated in FIG. 3P. This metal layer, i.e. the seed layer 36 and the metal layer 38 deposited on the seed layer 36, is considered as the second metal layer 13 (cf. FIGS. 1 and 2D). The thickness $d_2$ of the second metal layer 13 may be larger than 4 µm or 5 µm or 6 µm or 7 µm or 8 µm or 9 µm or 10 µm. Furthermore, the thickness $d_2$ may be at least four times or five times or six times or seven times or eight times or nine times or ten times larger than the thickness $d_1$ of the first metal layer 11. The thickness $d_2$ of the second metal layer 13 may be measured in areas where the second metal layer 13 extends laterally to the surface 26. The thickness $d_2$ may be the average of the thickness values measured in this area or may be the maximum value of the thickness values measured in this area.

A dielectric layer 39 may be deposited on top of the second metal layer 13 and may be opened in areas where external contact pads 40 are arranged as illustrated in FIG. 3Q. The dielectric layer 39 may be produced and structured by using the same or similar materials and processing steps as described above in connection with the dielectric layer 30. The external contact pads 40 allow to electrically contact the contact pads 24 of the semiconductor chips 10 and 22 from outside the devices 300. Some of the external contact pads 40 are exposed surfaces of the second metal layer 13 directly coupled to the contact pads 24. The other external contact pads 40 are coupled to the contact pads 24 via the first metal layer 11. In the latter case, the second metal layer 13 deposited on the first metal layer 11 in the area of the external contact pads 40 has the function of an under bump metallization. The under bump metallization having a thickness $d_2$ allows to place solder balls on the external contact pads 40. The first metal layer 11 alone may have a thickness which is too small to attach solder balls.

Solder deposits 41 may be placed onto the external contact pads 40 as illustrated in FIG. 3R. The solder deposits 41 may be applied to the external contact pads 40 by "ball placement", in which pre-shaped balls composed of solder material are applied to the external contact pads 40. As an alternative to "ball placement", the solder deposits 41 may, for example, be applied by using stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The solder deposits 41 may be used to electrically couple the devices 300 to other components, for example a PCB.

As illustrated in FIG. 3S, the devices 300 (and the semiconductor chips 10 and 22) are separated from one another by removing parts of the redistribution layer and the encapsulating material 25, for example by sawing, cutting, milling, etching or a laser beam.

The devices 300 manufactured by the method described above are fan-out type packages. The electrically insulating material 25 allows the redistribution layer to extend beyond the outline of the semiconductor chips 10 and 22. The external contact pads 40 therefore do not need to be arranged within the outline of the semiconductor chips 10 or 22 but can be distributed over a larger area. The increased area which is available for arrangement of the external contact pads 40 as a result of the electrically insulating layer 25 means that the external contact pads 40 cannot only be arranged at a great distance from one another, but that the maximum number of external contact pads 40 which can be arranged there is likewise increased compared to the situation when all the external contact pads 40 are arranged within the outline of the semiconductor chip 10 and 22. As an alternative to fan-out type packages, it is also possible to use the method described above for the manufacturing of fan-in type packages.

In the areas where the first metal layer 11 is covered with the dielectric material 12, the thickness $d_1$ of the first metal layer 11 is much smaller than the thickness $d_2$ of the second metal layer 13. Due to the reduced thickness $d_1$ of the first metal layer 11 fabrication costs are reduced and manufacturing throughput is increased. The reduced thickness of the first metal layer 11 also leads to a reduced thickness of the dielectric layer 12 covering the first metal layer 11 and thus implies a low topology of the redistribution layer which reduces the effort to produce redistribution layers including more than one metal layer. Redistribution layers including two or more metal layers stacked on top of each other are of interest for complex semiconductor chips, for example baseband chips for cellular phones.

It may be provided that the conductor lines of the first metal layer 11 are used for low power lines and the conductor lines of the second metal layer 13 are used for high power or highly conductive lines. Furthermore, the first metal layer 11 may also include electrical ground layers or electrical shielding layers.

It is obvious to a person skilled in the art that the devices 300 illustrated in FIG. 3S and the manufacturing thereof as described above are only intended to be an embodiment, and many variations are possible. For example, further semiconductor chips or passives may be included in the same device 300. The semiconductor chips and passives may differ in function, size, manufacturing technology etc. Moreover, it may be provided that the first metal layer 11 is entirely arranged within the outlines of the semiconductor chips 10 and 22 and does not extend beyond these outlines. In this case, the first metal layer 11 may, for example, have the function of a ground layer.

Figure 4:
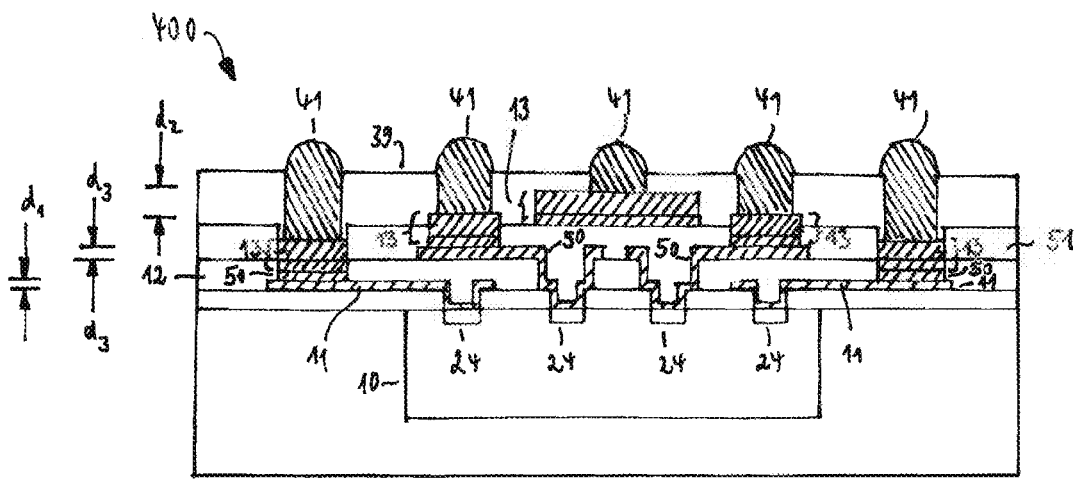
FIG. 4 schematically illustrates a cross-sectional view of one embodiment of a device including a semiconductor chip embedded in an encapsulation material and three metallization layers.

Furthermore, the devices 300 may include more than two metal layers, for example three, four or five metal layers stacked on top of each other. In FIG. 4 a device 400 is schematically illustrated in cross section which is very similar to the device 300 but includes three metal layers instead of two metal layers. The device 400 includes a third metal layer 50 that is arranged between the first metal layer 11 and the second metal layer 13. The third metal layer 50 may be produced as described above in connection with the first metal layer 11 and may have a thickness $d_3$ which is similar to the thickness $d_1$ of the first metal layer 11. For example, the third metal layer 50 may have a thickness $d_3$ which may be smaller than 500 nm or 450 nm or 400 nm or 350 nm or 300 nm or 250 nm or 200 nm or 150 nm. Furthermore, the thickness $d_2$ of the second metal layer 13 may be at least four times or five times or six times or seven times or eight times or nine times or ten times larger than the thickness $d_3$ of the third metal layer 50. The third metal layer 50 may be covered with a dielectric layer 51 which may be similar to the dielectric layer 12 covering the first metal layer 11.

In areas where the solder deposits 41 are placed, the first metal layer 11 may be covered with the third metal layer 50 and the second metal layer 13. The third metal layer 50 may be covered with the second metal layer 13 in areas where the solder deposits 41 are placed.

The device 400 illustrated in FIG. 4 includes two thin metal layers and one thick metal layer placed over the two thin metal layers. Other combinations of thin and thick metal layers are also possible, for example two thick metal layers may be placed on one thin metal layer. In another embodiment, one or two thin metal layers may be stacked on one or two thick metal layers, etc.

Figure 5:
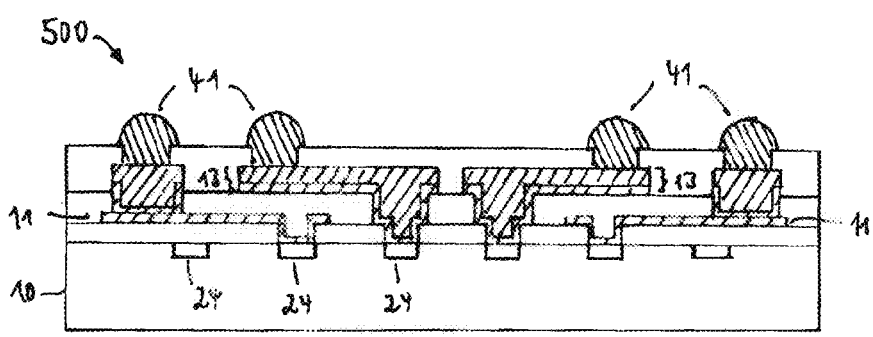
FIG. 5 schematically illustrates a cross-sectional view of one embodiment of a device including an partially exposed semiconductor chip and two metallization layers placed over the semiconductor chip.

A further variation of the device 300 is schematically illustrated in FIG. 5. The device 500 illustrated in FIG. 5 does not include an encapsulating material embedding the semiconductor chip 10. Therefore the entire redistribution layer is placed within the outline of the semiconductor chip 10. The device 500 is a wafer level packages (WLP). The term "wafer level package" relates to semiconductor chips having an active main surface that has been populated at the wafer level with external contact elements that are required for subsequently making contact with a PCB. The semiconductor chips (dies) have been singulated only after the application of the redistribution layer and the external contact elements. After singulation, a WLP can be mounted onto a PCB without significant further processing of the main surface. In one embodiment, mounting of the of the WLPs onto an interposer or a leadframe and packaging of the individual WLPs with a mold material or similar material are no longer necessary. WLPs are therefore distinguished by small size, small weight and low production costs.

Figure 6:
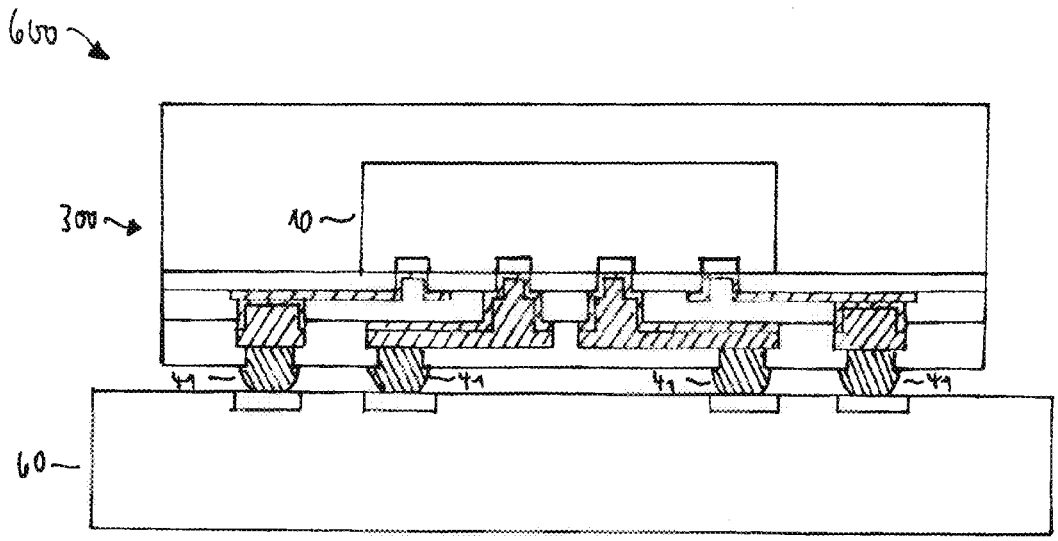
FIG. 6 schematically illustrates a cross-sectional view of one embodiment of a system including a circuit board and a device mounted on the circuit board.

FIG. 6 schematically illustrates a system 600 in cross section. The system 600 includes a circuit board 60, such as a PCB, and the device 300 mounted on the circuit board 60. The solder balls 41 of the device 300 are soldered to contact pads 61 of the circuit board 60.

In addition, while a particular feature or aspect of an embodiment of the invention may have been disclosed with respect to only one of several implementations, such feature or embodiment may be combined with one or more other features or embodiments of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a semiconductor chip;
   a first metal layer laterally extending over the semiconductor chip, the first metal layer having a first thickness;
   a dielectric layer disposed directly on portions of the first metal layer; and
   a second metal layer laterally extending over the dielectric layer, the second metal layer having a second thickness that is at least four times larger than the first thickness only at those portions of the first metal layer on which the dielectric layer is directly deposited, wherein the first thickness is smaller than 300 nm.

2. The device of claim 1, wherein the second thickness is larger than 4 µm.

3. The device of claim 1, wherein at least one first external contact pad is applied to the first metal layer.

4. The device of claim 3, wherein a first solder deposit is applied to the at least one first external contact pad.

5. The device of claim 4, wherein a second solder deposit is applied to the second metal layer.

6. The device of claim 1, wherein the semiconductor chip comprises a first contact pad which is in direct contact with the first metal layer.

7. The device of claim 1, wherein the semiconductor chip is embedded in an encapsulation material and the first metal layer extends laterally over the semiconductor chip and the encapsulation material.

8. A device, comprising:
a semiconductor chip;
a first metal layer laterally extending over the semiconductor chip, the first metal layer having a first thickness;
a dielectric layer laterally extending over the first metal layer; and
a second metal layer laterally extending over the dielectric layer, the second metal layer having a second thickness that is at least four times larger than the first thickness, wherein at least one first external contact pad is applied to the first metal layer, wherein the at least one first external contact pad has a thickness that is at least four times larger than the first thickness and wherein the first thickness is smaller than 300 nm.

9. A device, comprising:
a semiconductor chip;
a first metal layer laterally extending over the semiconductor chip, the first metal layer having a first thickness;
a dielectric layer laterally extending over the first metal layer; and
a second metal layer laterally extending over the dielectric layer, the second metal layer having a second thickness that is at least four times larger than the first thickness, wherein at least one first external contact pad is applied to the first metal layer, wherein the at least one first external contact pad has a thickness that is larger than 5 µm, and wherein the first thickness is smaller than 300 nm.

10. A device, comprising:
a semiconductor chip;
a first metal layer laterally extending over the semiconductor chip, the first metal layer having a first thickness;
a dielectric layer laterally extending over the first metal layer; and
a second metal layer laterally extending over the dielectric layer, the second metal layer having a second thickness that is at least four times larger than the first thickness, wherein the semiconductor chip comprises a second contact pad which is in direct contact with the second metal layer.

11. A device, comprising:
a semiconductor chip;
a first metal layer laterally extending over the semiconductor chip, the first metal layer having a first thickness being smaller than 300 nm;
a dielectric layer disposed directly on portions of the first metal layer; and
a second metal layer laterally extending over the dielectric layer, the second metal layer having a second thickness at least four times larger than the first thickness only at those portions of the first metal layer on which the dielectric layer is directly deposited.

12. A device, comprising:
a semiconductor chip;
an encapsulation material embedding the semiconductor chip;
a first metal layer laterally extending over the semiconductor chip and the encapsulation material, the first metal layer having a first thickness;
a dielectric layer disposed directly on portions of the first metal layer; and
a second metal layer laterally extending over the dielectric layer, the second metal layer having a second thickness that is at least four times larger than the first thickness only at those portions of the first metal layer on which the dielectric layer is directly deposited, wherein the first thickness is smaller than 300 nm.

13. A method, comprising:
providing a first semiconductor chip;
placing a first metal layer over the first semiconductor chip, the first metal layer having a first thickness;
placing a dielectric layer directly on portions of the first metal layer; and
placing a second metal layer over the dielectric layer, the second metal layer having a second thickness that is at least four times larger than the first thickness only at those portions of the first metal layer on which the dielectric layer is directly deposited, wherein the first thickness is smaller than 300 nm.

14. The method of claim 13, wherein the second thickness is larger than 4 µm.

15. The method of claim 13, wherein the first metal layer is produced by using one of sputtering, evaporation and electroless deposition.

16. The method of claim 13, wherein the second metal layer is produced by using galvanic deposition.

17. The method of claim 13, wherein a first portion of the second metal layer is placed directly onto the first metal layer.

18. The method of claim 17, wherein solder material is deposited on the first portion of the second metal layer.

19. The method of claim 13, wherein the first semiconductor chip and a second semiconductor chip are embedded in an encapsulation material before the first metal layer is placed over the first semiconductor chip.

20. The method of claim 19, wherein the first metal layer is placed over the encapsulation material.

21. The method of claim 19, wherein the first and second semiconductor chips are separated from each other by removing the encapsulation material partially after the placement of the second metal layer.

22. A method, comprising:
providing a semiconductor chip;
depositing a first metal layer on the semiconductor chip by using one of sputtering, evaporation and electroless deposition;
depositing a dielectric layer directly onto portions of the first metal layer; and
depositing a second metal layer on the dielectric layer by using galvanic deposition, wherein the first metal layer has a first thickness and the second metal layer has a second thickness that is at least four times larger than the first thickness only at those portions of the first metal layer on which the dielectric layer is directly deposited, wherein the first thickness is smaller than 300 nm.

* * * * *